(12) United States Patent
Shinoda et al.

(10) Patent No.: US 9,876,506 B2
(45) Date of Patent: Jan. 23, 2018

(54) MEASURING DEVICE, MEASURING SYSTEM, MEASURING METHOD, AND COMPUTER READABLE RECORDING MEDIUM

(71) Applicant: NEC Corporation, Tokyo (JP)

(72) Inventors: Shigeki Shinoda, Tokyo (JP); Shohei Kinoshita, Tokyo (JP); Yasuhiro Sasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 15/321,131

(22) PCT Filed: Jun. 24, 2015

(86) PCT No.: PCT/JP2015/003178
§ 371 (c)(1),
(2) Date: Dec. 21, 2016

(87) PCT Pub. No.: WO2015/198599
PCT Pub. Date: Dec. 30, 2015

(65) Prior Publication Data
US 2017/0134035 A1    May 11, 2017

(30) Foreign Application Priority Data
Jun. 26, 2014    (JP) ................................ 2014-131193

(51) Int. Cl.
*H03M 1/12* (2006.01)
*H03M 1/10* (2006.01)
(Continued)

(52) U.S. Cl.
CPC .......... *H03M 1/1071* (2013.01); *G01R 15/08* (2013.01); *G01R 23/16* (2013.01); *H03M 1/12* (2013.01)

(58) Field of Classification Search
CPC ...... H03M 1/1071; H03M 1/12; G01R 15/08; G01R 23/16
(Continued)

(56) References Cited

U.S. PATENT DOCUMENTS 5,063,383 A * 11/1991 Bobba .................. H03M 1/108
324/73.1
6,211,803 B1 * 4/2001 Sunter .................. H03M 1/109
341/118
(Continued)

FOREIGN PATENT DOCUMENTS

EP     2485395 A1    8/2012
JP     H01-174123 A  7/1989
(Continued)

OTHER PUBLICATIONS

International Search Report corresponding to PCT/JP2015/003178, 1 page, dated Sep. 1, 2015.
(Continued)

*Primary Examiner* — Lam T Mai
(74) *Attorney, Agent, or Firm* — Wilmer Cutler Pickering Hale & Dorr

(57) ABSTRACT

To provide a measuring device wherein a measurement range corresponding to a wave shape to be measured can be set with a simple configuration. A measuring device (100) has: a measuring unit that measures changes of indexes with time, said indexes relating to an object event; a conversion unit that converts a measurement value measured by means of the measuring unit into a predetermined format within a previously set measurement range; and a control unit that controls the measurement range. The control unit changes the measurement range in the cases where a conversion value obtained by converting the measurement value by
(Continued)

means of the conversion unit satisfies predetermined conditions in a predetermined period.

11 Claims, 15 Drawing Sheets

(51) Int. Cl.
  *G01R 15/08* (2006.01)
  *G01R 23/16* (2006.01)

(58) Field of Classification Search
  USPC .......................................................... 341/155
  See application file for complete search history.

(56) References Cited

U.S. PATENT DOCUMENTS

| | | | | |
|---|---|---|---|---|
| 9,008,334 | B2* | 4/2015 | Ayres | ..................... H03G 3/301 |
| | | | | 381/107 |
| 2002/0030616 | A1* | 3/2002 | Hiramatsu | .............. H03M 1/10 |
| | | | | 341/120 |
| 2012/0201400 | A1 | 8/2012 | Ayres | |

FOREIGN PATENT DOCUMENTS

| JP | 2004-134917 A | 4/2004 |
|---|---|---|
| JP | 2007-205891 A | 8/2007 |
| JP | 2010-124250 A | 6/2010 |

OTHER PUBLICATIONS

Written Opinion of the International Search Authority corresponding to PCT/JP2015/003178 with English translation, 8 pages, dated Sep. 1, 2015.

* cited by examiner

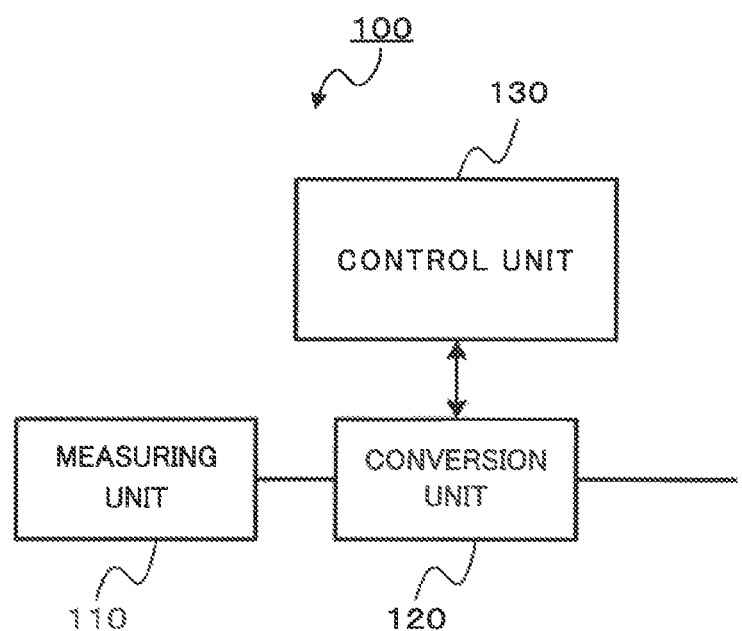

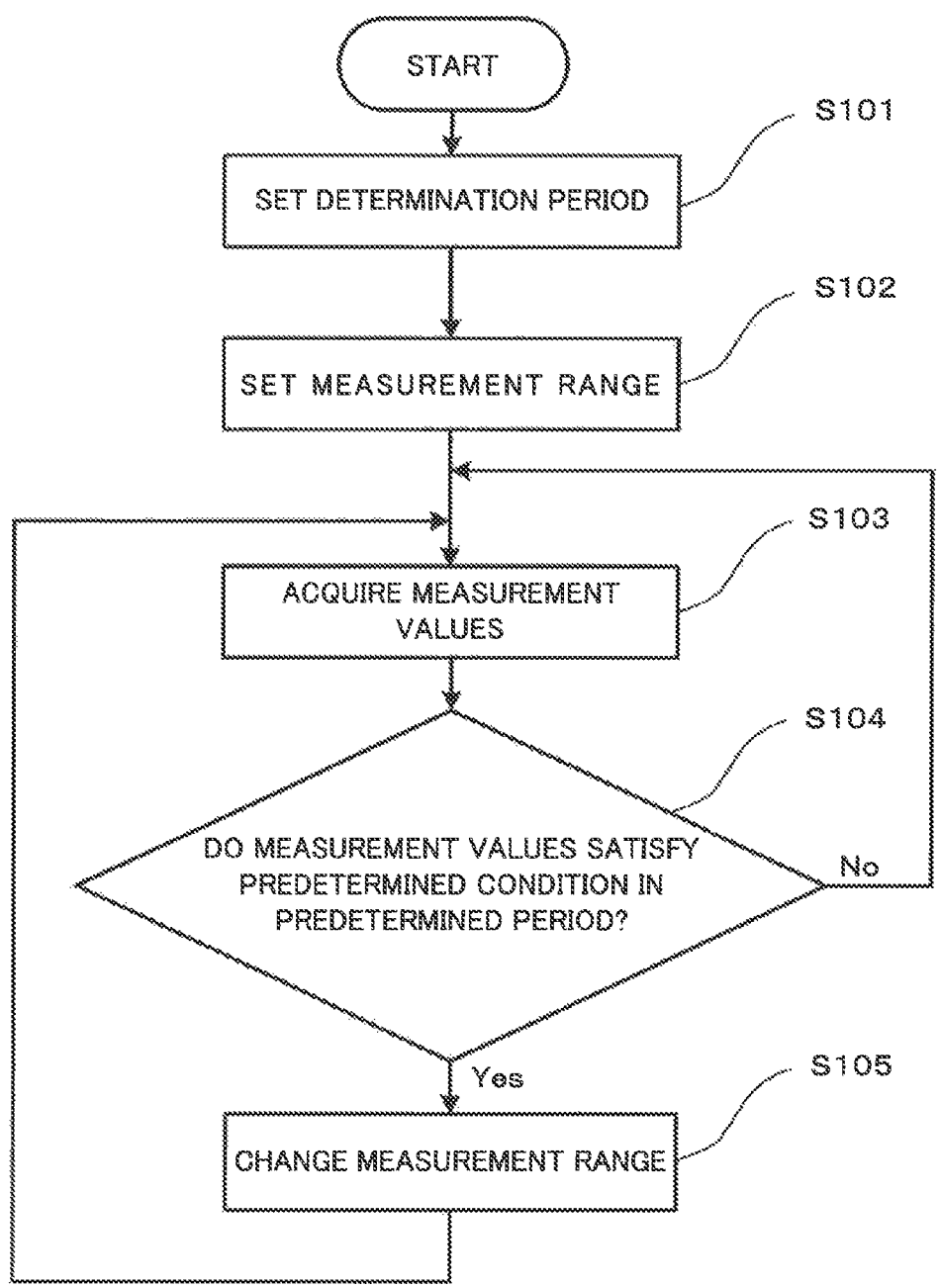

FREE VIBRATION WAVE SHAPE
(ENLARGED)

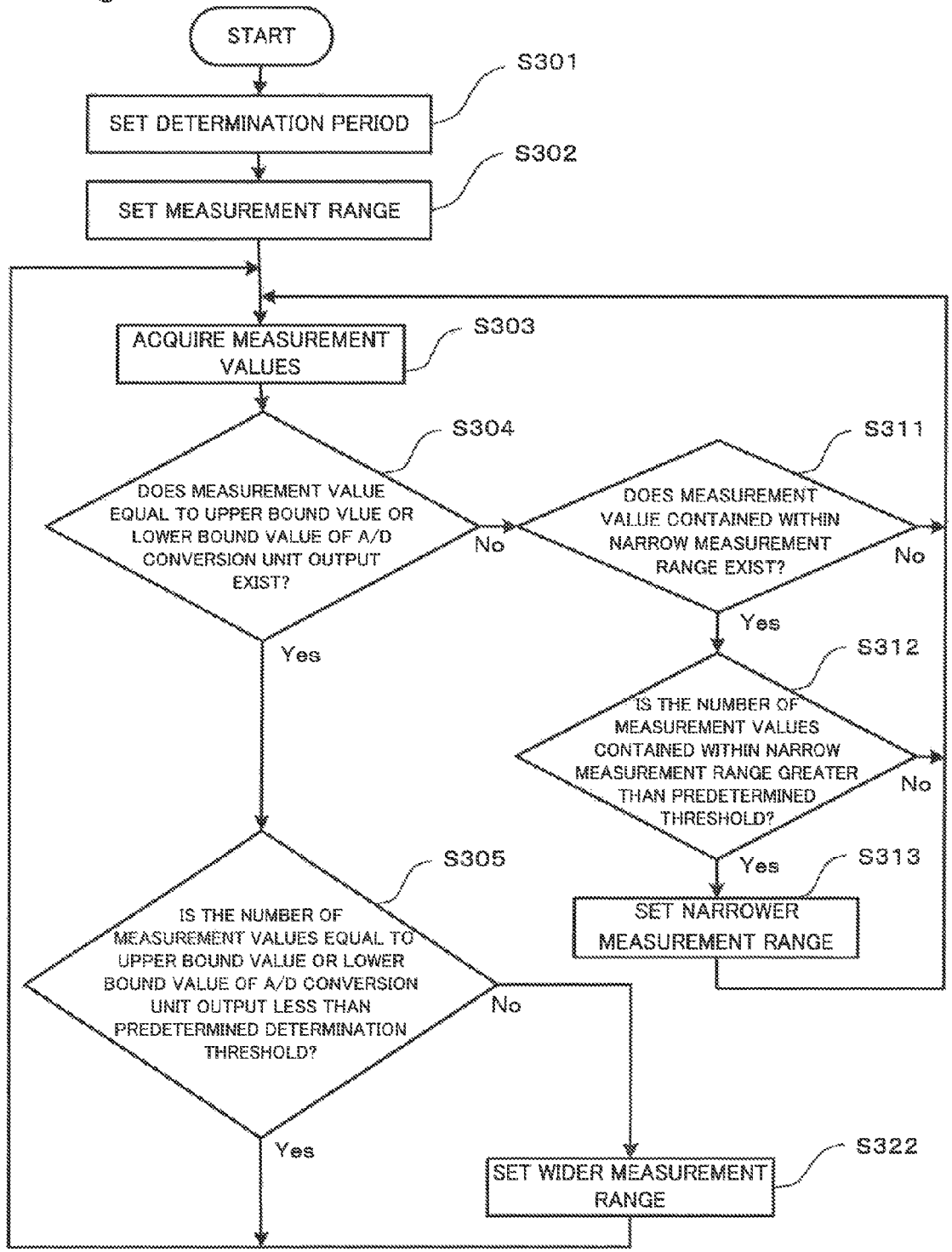

MEASURING DEVICE, MEASURING SYSTEM, MEASURING METHOD, AND COMPUTER READABLE RECORDING MEDIUM

CROSS-REFERENCE TO RELATED APPLICATIONS

This application is a national stage application of International Application No. PCT/JP2015/003178 entitled "MEASURING DEVICE, MEASURING SYSTEM, MEASURING METHOD, AND COMPUTER READABLE RECORDING MEDIUM," filed on Jun. 24, 2015, which claims the benefit of the priority of Japanese Patent Application No. 2014-131193 filed on Jun. 26, 2014, the disclosures of each of which are hereby incorporated by reference in their entirety.

TECHNICAL FIELD

The present invention relates to a measuring device, a measuring system, a measuring method, and a computer-readable recording medium.

BACKGROUND ART

A measuring device for detecting vibration is required to have a wide measurement dynamic range and high measurement resolution. Meanwhile, such a measuring device is required to be low in price and to consume low power.

In PTL1, an automatic input-output characteristics adjustment method is described. The method described in PTL1 calculates a variation per unit time of an analog input signal, and, on the basis of the variation, predicts whether all bits of output data are to be valid within a certain period of time. In the method described in PTL1, the input range of an A/D (Analog-to-Digital) converter is adjusted based on a result from the prediction.

In PTL2, a measuring device that has an auto-ranging function, in which measurement is carried out using a desirable measurement range out of a plurality of measurement ranges depending on the magnitudes of measurement values, and is capable of selecting an appropriate measurement range in a short period of time is described.

CITATION LIST

Patent Literature

[PTL1] JP 01-174123 A
[PTL2] JP 2007-205891 A

SUMMARY OF INVENTION

Technical Problem

In analyzing vibration, there is a case where a free vibration wave shape, which is generated by a free vibration in a specific vibration mode after an occurrence of a shock response, is used. In such a case, the magnitude of vibration in the free vibration wave shape in a specific vibration mode sometimes becomes substantially small compared with an instantaneous maximum magnitude of vibration in a shock response. Therefore, when such a vibration is analyzed using a method described in PTL1 and the like, an input range (measurement range) is required to be adjusted following changes in the magnitude of vibration. To adjust the input range so as not to affect the vibration measurement, it becomes necessary to use a measuring device that operates fast. That is, there is a problem that, in the cases of analyzing vibration using a method described in PTL1 and the like, a measuring device becomes complicated.

In order to solve the aforementioned problem, a principal object of the present invention is to provide a measuring device and the like that are capable of setting a measurement range depending on an alternating wave shape to be measured with a simple configuration.

Solution to Problem

A measuring device in one aspect of the present invention,
A measuring system in another aspect of the present invention,
A measuring method in still another aspect of the present invention,
A computer-readable recording medium in still another aspect of the present invention,

Advantageous Effects of Invention

The present invention may provide a measuring device and the like that are capable of setting a measurement range depending on an alternating wave shape to be measured with a simple configuration.

BRIEF DESCRIPTION OF DRAWINGS

FIG. 1 is a diagram illustrating a measuring device in a first example embodiment of the present invention;

FIG. 2 is a flowchart illustrating an operation of the measuring device in the first example embodiment of the present invention;

FIG. 7 is a flowchart illustrating an operation of the measuring device in the third example embodiment of the present invention;

DESCRIPTION OF EMBODIMENTS

First Example Embodiment

Figure 14:
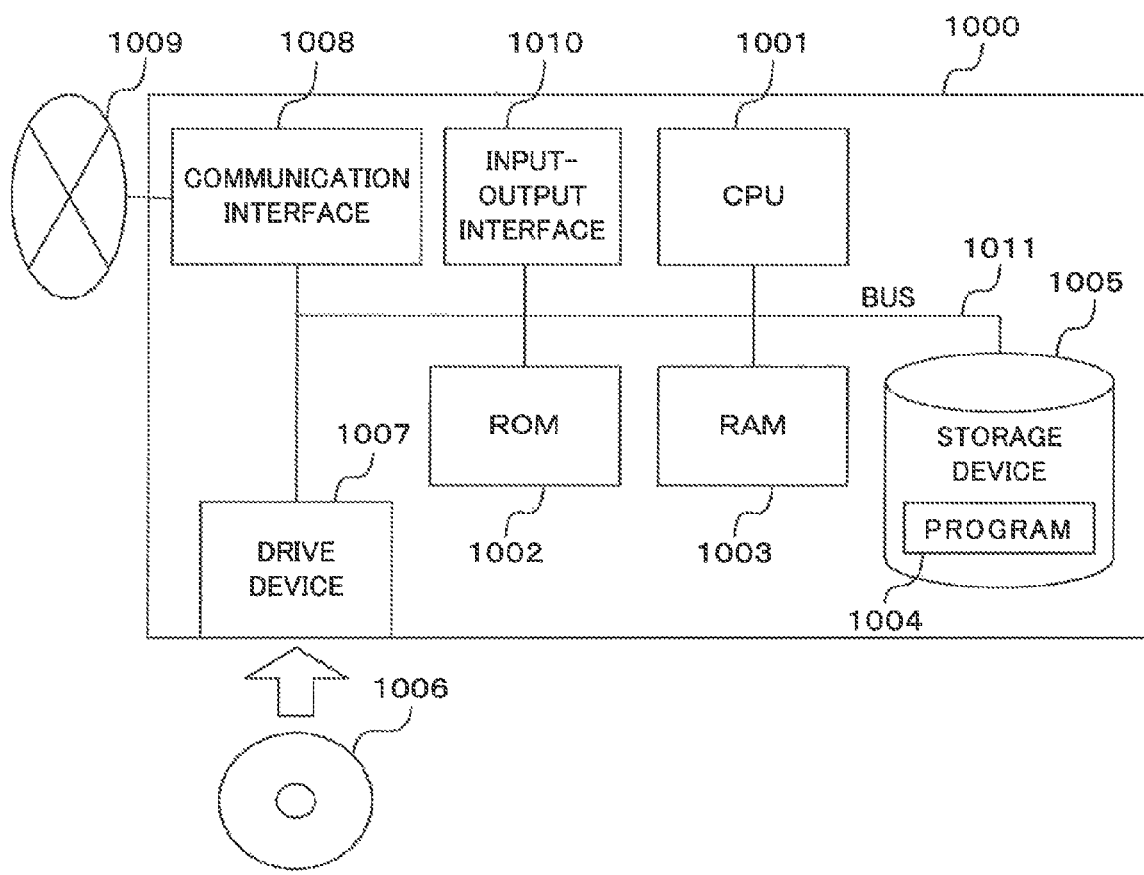
FIG. 14 is a diagram illustrating a configuration of an information processing device that achieves the measuring devices and the like in the respective example embodiments of the present invention.

Respective example embodiments of the present invention will be described with reference to the accompanying drawings. In the respective example embodiments of the present invention, each component in respective devices indicates a block including a functional unit. Each component in the respective devices may be achieved by any combination of, for example, an information processing device 1000 as illustrated in FIG. 14 and software. As an example, the information processing device 1000 includes a configuration as described below.

A CPU (Central Processing Unit) 1001

A ROM (Read Only Memory) 1002

A RAM (Random Access Memory) 1003

A program 1004 loaded into the RAM 1003

A storage device 1005 storing the program 1004

A drive device 1007 carrying out reading and writing from/to a storage medium 1006

A communication interface 1008 connecting to a communication network 1009

An input-output interface 1010 carrying out inputting and outputting of data

A bus 1011 connecting the respective components

Methods for achieving the respective devices include various variations. For example, each device may be achieved as a dedicated device including a hardware logical circuit and the like. Each device may also be achieved by a combination of a plurality of devices.

Figure 3A:
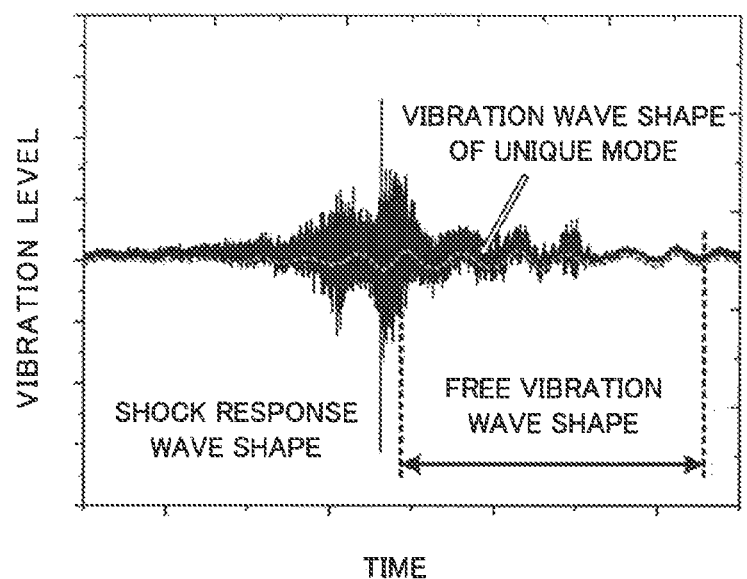
FIG. 3A is a diagram illustrating an example of an alternating wave shape acquired by the measuring device in the first example embodiment of the present invention.
Figure 3B:
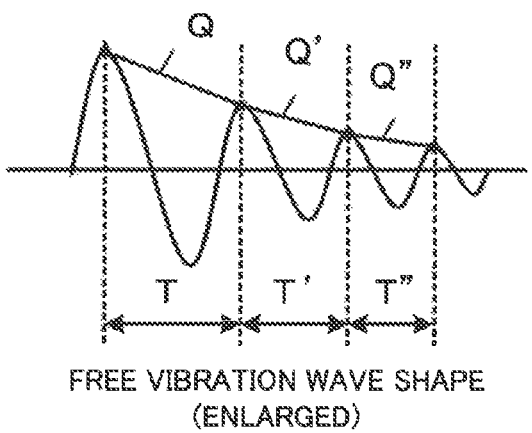
FIG. 3B is a diagram illustrating the example of the alternating wave shape acquired by the measuring device in the first example embodiment of the present invention.

First, a first example embodiment of the present invention will be described. FIG. 1 is a diagram illustrating a measuring device in the first example embodiment of the present invention. FIG. 2 is a flowchart illustrating an operation of the measuring device in the first example embodiment of the present invention. FIGS. 3A and 3B are diagrams illustrating examples of alternating wave shapes acquired by the measuring devices in the first example embodiment of the present invention.

As illustrated in FIG. 1, a measuring device 100 in the first example embodiment of the present invention includes a measuring unit 110, a conversion unit 120, and a control unit 130. The measuring unit 110 measures an alternating wave shape. The conversion unit 120 converts measurement values measured by the measuring unit 110 into a predetermined format. The control unit 130 controls a measurement range that is set in the conversion unit 120.

The measuring unit 110 measures changes of a freely-selected index with time, the index relating to an event to be measured, in a continuous or discontinuous manner. Measurement values acquired through measurement by the measuring unit 110 form a wave shape representing changes of the measured index with time. The wave shape includes a wave shape in which the magnitude and direction of measurement values change with time. Wave shapes in which the magnitude and direction of a signal change with time include an alternating wave shape. In the respective example embodiments of the present invention, it is assumed that measurement values form a wave shape the magnitude and direction of which change with time. In the following description, a magnitude of a measurement value acquired at a certain point of time by the measuring unit 110 may be simply referred to as a magnitude of a wave shape. Examples of such an alternating wave shape include, for example, a vibration wave shape generated when an object, such as a structure, vibrates. In the cases of measuring a vibration, the measuring unit 110 measures changes of an arbitrary index with time in a continuous or discontinuous manner, the index relating to the magnitude of the vibration (for example, the displacement, velocity, acceleration, and the like of the vibration). When the measuring unit 110 measures an index relating to the magnitude of a vibration as described above, a piezoelectric type vibration sensor is, for example, used as the measuring unit 110.

The conversion unit 120 converts measurement values measured by the measuring unit 110 into a predetermined format. A measurement range, which is a range within which measurement values may be converted, is set by the conversion unit 120. The measurement range is changed depending on measurement values. As an example, the conversion unit 120 is configured to use an A/D converter. In this case, the conversion unit 120 converts measurement values, representing a vibration wave shape and the like, measured by the measuring unit 110 into a digital signal. It is possible to achieve a configuration in which the measurement values converted by the conversion unit 120 are transmitted to the outside by means of any communication unit, for example.

The control unit 130 controls a measurement range set in the conversion unit 120. The control unit 130 carries out control in such a way that the measurement range is changed when values into which measurement values are converted by the conversion unit 120 satisfy a predetermined condition in a predetermined period. As an example, when values into which measurement values are converted by the conversion unit 120 reach the upper bound of a measurement range set in the conversion unit 120 continuously in a certain period, the control unit 130 carries out control so as to widen the measurement range. The control unit 130 may be configured to communicate with the outside by means of a freely-selected communication means, for example. The control unit 130 may also be configured to communicate with the conversion unit 120 by using a freely-selected communication means to control the measurement range set in the conversion unit 120.

Next, using FIG. 2, an operation of the measuring device 100 in the present example embodiment will be described.

In the measuring device 100, the control unit 130 first sets a determination period that serves as the above-described predetermined period (step S101). A length of the determination period is defined in an appropriate manner based on an event to be measured such as a vibration, characteristics of the measuring unit 110, or the like.

Subsequently, the control unit 130 sets the measurement range in the conversion unit 120 (step S102). The measurement range is defined in an appropriate manner based on an event to be measured such as a vibration, characteristics of the measuring unit 110, or the like.

Subsequently, the measuring unit 110 measures changes of any index with time, the index relating to an event to be measured, such as the displacement and acceleration of a vibration, to acquire measurement values in the determination period having been set in step S101 (step S103). The measuring unit 110 acquires measurement values in a period during which determination can be made in a step that will be described later, for example.

Subsequently, the control unit 130 determines whether the measurement values acquired in step S103 satisfy the predetermined condition in the determination period having been set in step S101 (step S104).

When determining that the measurement values satisfy the predetermined condition in the determination period, the control unit 130 changes the measurement range set in the conversion unit 120 (step S105). In this case, when the measurement range set in the conversion unit 120 is changed, the measuring unit 110 returns to step S103 and measures changes of the index with time, the index relating to the object event, to acquire measurement values. In the cases of determining that the measurement values do not satisfy the predetermined condition in the determination period, the measuring unit 110 returns to step S103 and measures changes of the index with time, the index relating to the object event, to acquire measurement values.

In step S105, when values into which measurement values are converted by the conversion unit 120 reach the upper bound of the measurement range set in the conversion unit 120 continuously in a certain period, for example, the control unit 130 controls to widen the measurement range. Widening a measurement range is equivalent to, for example, increasing an upper bound value (or decreasing a lower bound value) for measurement values that are subject to conversion by the conversion unit 120. Controlling the measurement range in such a manner enables the conversion unit 120 to convert a larger alternating wave shape than before the change of the measurement range, for example. When a maximum value of the values into which the measurement values are converted by the conversion unit 120 is smaller than a predetermined magnitude continuously in a certain period, for example, the control unit 130 controls to narrow the measurement range. Narrowing the measurement range is equivalent to, for example, decreasing an upper bound value (or increasing a lower bound value) for measurement values that are subject to conversion by the conversion unit 120. Controlling the measurement range in such a manner enables the conversion unit 120 to improve accuracy in conversion of an alternating wave shape, for example. In step S105, the control unit 130 may control the measurement range set in the conversion unit 120 by any method other than the above-described method.

Next, using FIGS. 3A and 3B, a relation between an alternating wave shape acquired by measurement and a measurement range set in the conversion unit 120 included in the measuring device 100 in the present example embodiment will be described. FIG. 3A illustrates a vibration wave shape, which is an example of an alternating wave shape acquired by the measuring unit 110 carrying out measurement, and a vibration wave shape of a predetermined unique mode included in the vibration wave shape. In FIG. 3A, the horizontal axis represents the time and the vertical axis represents an index indicating the magnitude of a vibration wave shape (for example, acceleration, velocity, or displacement measured by the measuring unit 110 and voltage output from the measuring unit 110 are included). FIG. 3B is an enlarged view of the free vibration wave shape in FIG. 3A. In FIG. 3B, Q denotes mechanical sharpness of an object to which a vibration illustrated in FIG. 3A is generated and T denotes a period of the vibration. The period T satisfies a relation T=1/f where f denotes a resonant frequency of the object. In the cases of determining a state of a structure by analyzing a vibration wave shape, obtaining a mechanical sharpness and a resonant frequency enables representing mechanical characteristics of the structure to be determined.

The measuring device 100 in the present example embodiment is used for, as an example, diagnosing abnormality and deterioration in a structure such as pipes in water supply and the like, and a bridge. In such a case, an alternating wave shape acquired through measurement by the measuring unit 110 is a vibration wave shape. Deterioration diagnosis of a structure is carried out using a free vibration wave shape, which is generated after a shock response has occurred, for example, within a vibration wave shape acquired through measurement by the measuring unit 110. In particular, there is a case where a vibration wave shape of a predetermined unique mode included in the free vibration wave shape is used. In such a case, it is sometimes required to capture minute chronological changes in a resonant frequency and resonance sharpness of a structure calculated from the vibration wave shape.

As illustrated in FIG. 3A, the magnitude of a free vibration wave shape (that is, the magnitude of any index such as acceleration and displacement, which are measurement values) is sometimes smaller than that of a shock response wave shape which is generated upon occurrence of a shock response. Therefore, if the control unit 130 controls the measurement range set in the conversion unit 120 in such a way that the measurement range set in the conversion unit 120 is adapted to the shock response, there is a case where resolution becomes insufficient for analyzing the free vibration wave shape. On the other hand, if the control is carried out in such a way that the measurement range set in the conversion unit 120 is changed depending on vibration wave shapes generated by respective ones of the shock response and the free vibration thereafter, there is a case where correct measurement values cannot be acquired during control of the range change. In order to shorten a period during which correct measurement values cannot be acquired, the conversion unit 120 and the control unit 130 are required to operate fast. Thus, in the cases of operating fast for this purpose, the conversion unit 120 and the control unit 130 are required to have complicated configurations, and their power consumption increase.

In the measuring device 100 in the present example embodiment, when the measurement values measured by the measuring unit 110 satisfy a predetermined condition in a predetermined period, the control unit 130 changes the measurement range set in the conversion unit 120. In the measuring device 100 in the present example embodiment, when a free vibration wave shape is to be measured, the control unit 130 sets an input level to the conversion unit 120 at a level required for measurement of the free vibration wave shape, for example. The control unit 130 sets the determination period and the predetermined condition so as to change the measurement range set in the conversion unit 120 in the cases where, for example, a large vibration is occurred for a longer period than a period during which a large vibration caused by a shock response is occurred.

As an example, the control unit 130 may control so as not to change the measurement range for a shock response wave shape but to keep the measurement range that was set at the beginning because, while a shock response is a large vibration, a period during which the shock response wave shape is generated is shorter than a preset period. On the other hand, with regard to a free vibration wave shape, changes in the magnitude of vibration are slower than those of a shock response wave shape. Therefore, in the cases where a free vibration wave shape is large to the extent that correct measurement values cannot be acquired by a previously set measurement range, the control unit 130 may control to change the measurement range so that correct measurement values can be acquired.

That is, in the measuring device 100 in the present example embodiment, the control unit 130 may carry out control in such a way that the measurement range set in the conversion unit 120 is changed when it is required for analysis of a signal. Such a configuration enables the measuring device 100 in the present example embodiment to acquire the measurement values representing a wave shape to be analyzed at a measurement level suitable for the magnitude thereof.

The measuring device 100 according to the present example embodiment may reduce the number of occasions of the control unit 130 controlling change of the measurement range set in the conversion unit 120, compared with a case of controlling change of the measurement range depending on the magnitudes of measurement values representing a wave shape such as an alternating wave shape. Thus, the conversion unit 120 and the control unit 130 become less required to operate fast. Therefore, it is possible to make the conversion unit 120 and the control unit 130 have inexpensive and simple configurations. In addition, it is also possible to reduce power consumption in the conversion unit 120 and the control unit 130 due to the similar reason.

The control unit 130 may carry out control so as not to change the measurement range but to keep the measurement range having been set at the beginning when a large signal is input due to not only a shock response wave shape but also a sudden disturbance for example.

As described thus far, in the measuring device 100 according to the present example embodiment, the control unit 130 controls to change a measurement range used by the conversion unit 120 when values into which measurement values are converted by the conversion unit 120 satisfy a predetermined condition in a predetermined period. For this purpose, in the measuring device 100 in the present example embodiment, the control unit 130 may control not to change the measurement range set in the conversion unit 120 for a large vibration that is input transiently, such as a shock response. Therefore, the conversion unit 120 and the control unit 130 may become less required to operate fast following changes in the magnitudes of measurement values included in an alternating wave shape. Accordingly, the measuring device 100 in the first example embodiment of the present invention may provide a measuring terminal that is capable of changing the measurement range with a simple configuration.

Second Example Embodiment

Figure 4:
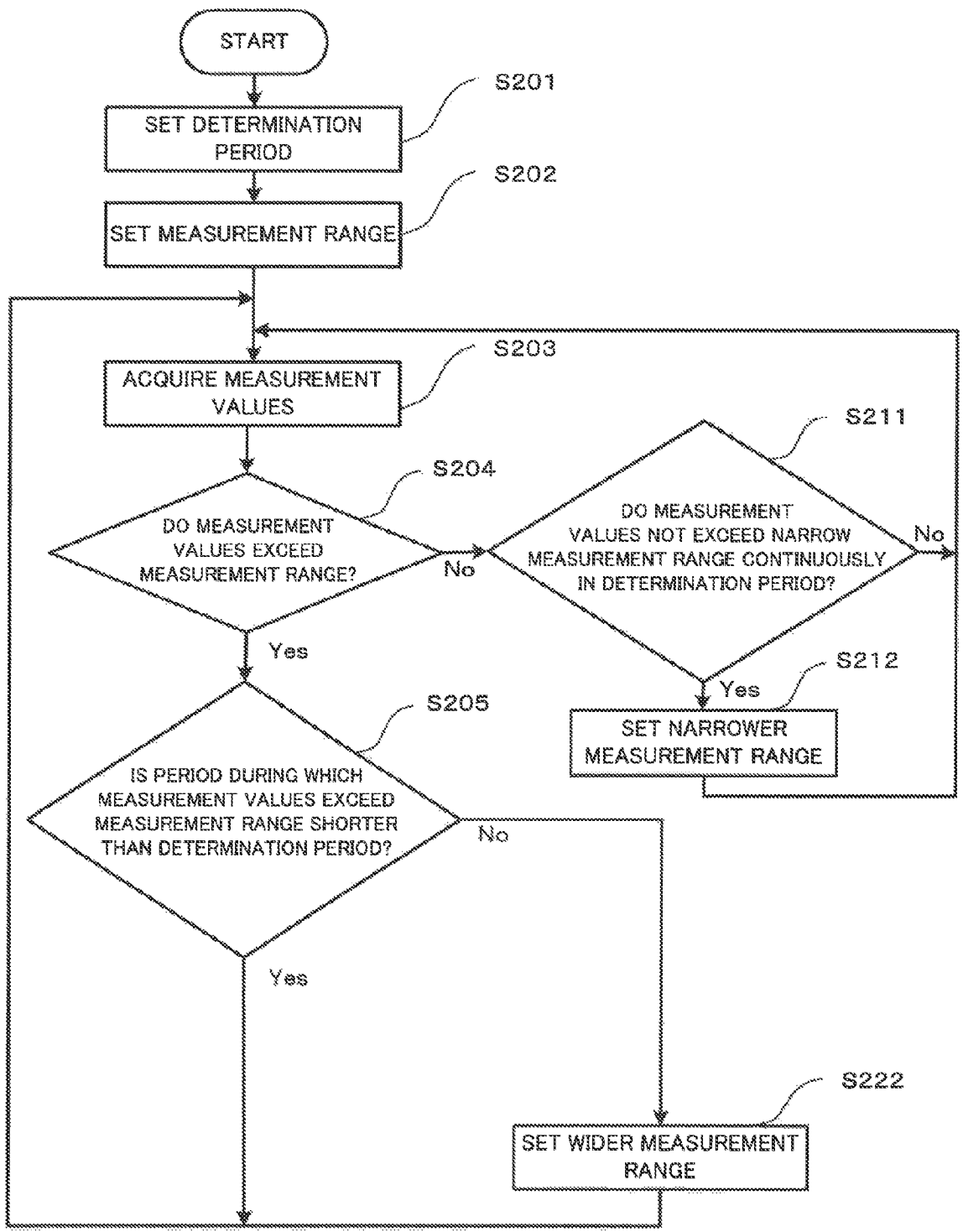
FIG. 4 is a flowchart illustrating an operation of a measuring device in a second example embodiment of the present invention.
Figure 5:
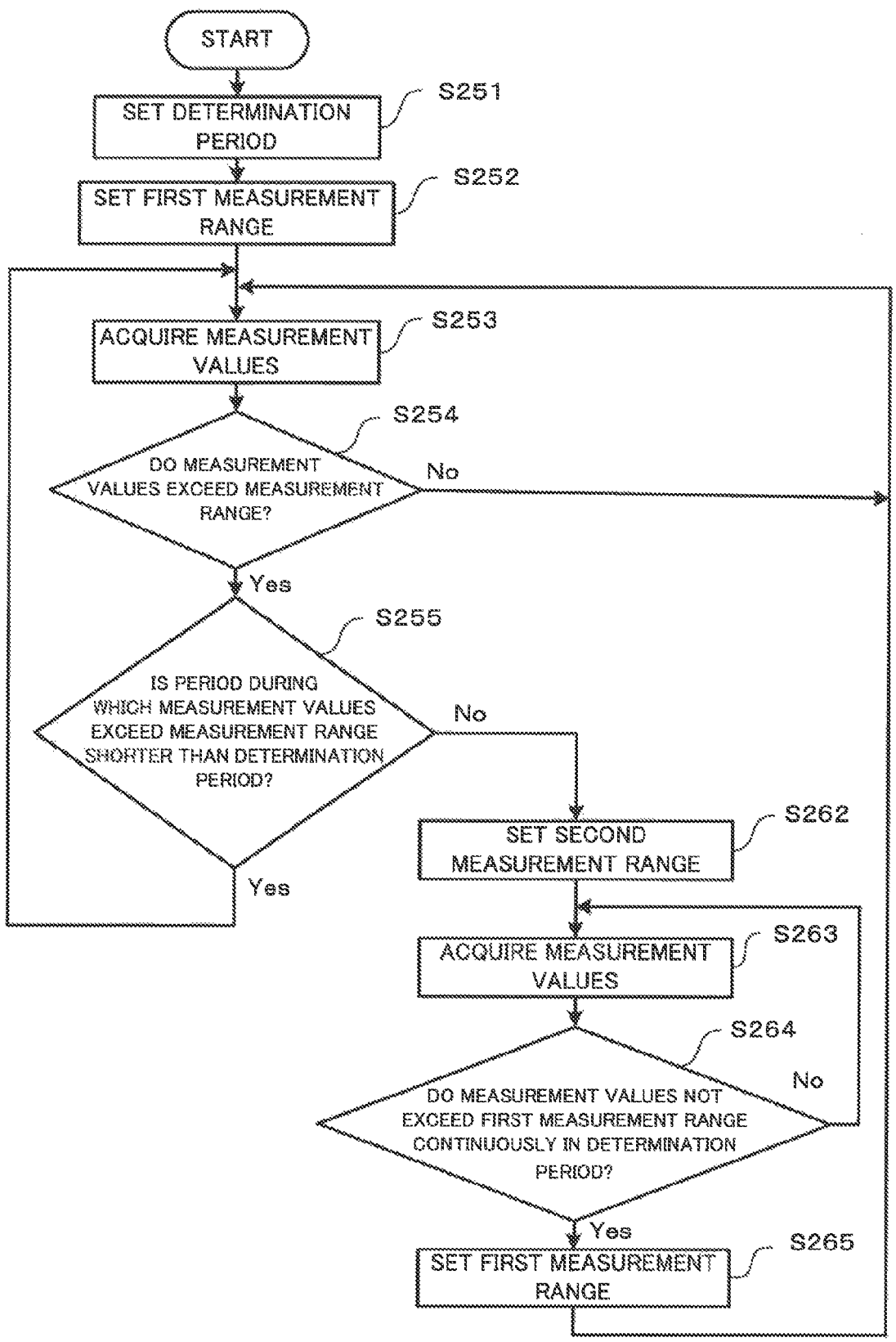
FIG. 5 is a flowchart illustrating an operation of a measuring device in a variation of the second example embodiment of the present invention.

Subsequently, a second example embodiment of the present invention will be described. FIG. 4 is a flowchart illustrating an operation of a measuring device in the second example embodiment of the present invention. FIG. 5 is a flowchart illustrating an operation of a measuring device 100 in a variation of the second example embodiment of the present invention. A measuring device 100 in the second example embodiment of the present invention may have the similar configuration as that of the measuring device 100 in the first example embodiment of the present invention.

Using FIG. 4, an operation of the measuring device 100 in the second example embodiment of the present invention will be described.

In the measuring device 100, the control unit 130 first sets a determination period which serves as the above-described predetermined period (step S201). Subsequently, the control unit 130 sets a measurement range in the conversion unit 120 (step S202). Next, the measuring unit 110 carries out measurement in the same manner as in the operation of the measuring device 100 in step S103 in the first example embodiment to acquire measurement values (step S203). In the steps described thus far, the measuring device 100 in the present example embodiment may operate in the same manner as the measuring device 100 in the first example embodiment of the present invention.

Subsequently, the control unit 130 determines whether the measurement values acquired in step S203 exceed the measurement range (step S204). In step S204, when it is determined that a measurement value exceeds the measurement range, the control unit 130 performs an operation in step S205. That is, the control unit 130 determines whether a period during which the measurement values acquired in step S203 exceed the measurement range is shorter than the determination period having been set in step S201.

In step S205, when it is determined that a period during which the measurement values exceed the measurement range is shorter than the determination period, the control unit 130 determines that a large wave shape, such as a shock response and disturbance is suddenly occurred to measure large measurement values. In this case, the measuring device 100 returns to step S203 and performs acquisition of measurement values by means of the measuring unit 110. On the other hand, in step S205, when it is determined that a period during which the measurement values exceed the measurement range is longer than the determination period, the control unit 130 determines that a vibration that exceeds the measurement range constantly has been measured. In this case, the control unit 130 sets the measurement range wider than the measurement range that has been set in the conversion unit 120 at this point of time (step S222). That is, in the cases of determining that a large vibration such that the measurement values constantly exceed the measurement range is measured continuously during the determination period, the control unit 130 changes the measurement range set in the conversion unit 120 to the measurement range that is wider than the measurement range having been set theretofore. When the setting operation of the measurement range in step S222 is finished, the measuring device 100 returns to step S203 and carries out acquisition of the measurement values by means of the measuring unit 110.

In the cases where the control unit 130 sets the wide measurement range in step S222, the newly set measurement range may be a predetermined range or any measurement range determined based on the measurement values so that the measurement values do not exceed the measurement range, for example.

In addition, in step S204, when it is determined that none of the measurement value exceeds the measurement range, the control unit 130 determines whether the measurement values exceed the limits of a predetermined narrow measurement range continuously in the determination period (step S211). In this case, the predetermined narrow measurement range is, for example, a measurement range narrower than the measurement range that has been set in the conversion unit 120 at this point of time. When it is determined that none of the measurement value exceeds the predetermined narrow measurement range continuously in the determination period (the measurement values are included within the predetermined narrow measurement range), the control unit 130 sets the narrow measurement range as a measurement range in the conversion unit 120 (step S212). When the setting operation of the measurement range in step S212 is finished, the measuring device 100 returns to step S203 and carries out acquisition of the measurement values by means of the measuring unit 110. That is, in the cases of determining that a small vibration that does not exceed the predetermined narrow measurement range constantly is to be measured, the control unit 130 changes the measurement range set in the conversion unit 120 to the measurement range that is narrower than the measurement range having been set theretofore.

On the other hand, in step S211, when it is determined that there is a case where a measurement value exceeds the predetermined narrow measurement range in the determination period, the measuring device 100 returns to step S203 and carries out acquisition of the measurement values.

When the control unit 130 sets the narrow measurement range in step S212, the measurement range newly set may be a predetermined range, or any measurement range that is determined based on measurement values so that, for example, the measurement values do not exceed the measurement range.

That is, when the control unit 130 determines that measurement values are constantly large or small, the measuring device 100 in the present example embodiment sets the measurement ranges wider or narrower than the measurement range that has been set in the conversion unit 120 at the time of the determination, respectively. Therefore, the measuring device 100 in the present example embodiment may provide the similar advantageous effects as those of the measuring device 100 in the first example embodiment. The measuring device 100 according to the present example embodiment, by setting a measurement range depending on measurement values, may increase measurement accuracy compared with the measuring device 100 in the first example embodiment.

Variation of the Second Example Embodiment

In the present example embodiment, several variations are conceivable. FIG. 5 is a flowchart illustrating an operation of a measuring device 100 in a variation of the second example embodiment of the present invention. Using FIG. 5, the operation of the measuring device 100 in the variation of the second example embodiment of the present invention will be described. It is assumed that a configuration of the measuring device 100 in the variation is the similar to those of the measuring devices 100 in the first and second example embodiments of the present invention.

In the measuring device 100, the control unit 130 first sets a determination period, which serves as the above-described predetermined period (step S251). Subsequently, the control unit 130 sets a measurement range in the conversion unit 120 to a predetermined first measurement range (step S252). Next, the measuring unit 110 carries out measurement in the similar manner as in the operation of the measuring device 100 in step S103 in the first example embodiment to acquire measurement values (step S253).

Subsequently, the control unit 130 determines whether the measurement values acquired in step S253 exceed the measurement range (step S254). In the cases where, in step S254, it is determined that a measurement value exceeds the measurement range, the control unit 130 carries out an operation in step S255. That is, the control unit 130 determines whether a period during which the measurement values exceed the measurement range is shorter than the determination period.

In step S255, when it is determined that a period during which the measurement values exceed the measurement range is shorter than the determination period, the control unit 130 determines that a large vibration, such as a shock response and disturbance, was occurred suddenly and has been measured. In this case, the measuring device 100 returns to step S253 and carries out acquisition of the measurement values by means of the measuring unit 110.

On the other hand, in step S255, when a period during which the measurement values exceed the measurement range is longer than the determination period, the control unit 130 determines that a vibration that exceeds the measurement range constantly has been measured. In this case, the control unit 130 sets a second measurement range wider than the first measurement range (step S262). That is, in the cases of determining that a large vibration that the measurement values constantly exceed the first measurement range is measured continuously in the determination period, the control unit 130 changes the measurement range set in the conversion unit 120 to the second measurement range.

When the setting operation of a measurement range in step S262 is finished, the measuring device 100 carries out acquisition of the measurement values by means of the measuring unit 110 (step S263). The control unit 130 determines that the measurement values do not exceed the limits of the first measurement range continuously in a determination period (step S264). When it is determined that the measurement values do not exceed the first measurement range in the determination period, the control unit 130 sets the measurement range set in the conversion unit 120 to the first measurement range (step S265). When it is determined that there is a case where the measurement value exceeds the first measurement range in the determination period, the measuring device 100 returns to step S263 and performs acquisition of measurement values again.

In step S254, when it is determined that no measurement value exceeds the measurement range, the measuring device 100 returns to step S253 and carries out acquisition of measurement values again.

That is, when the measurement range set in the conversion unit 120 can take values at two levels, the measuring device 100 in the present example embodiment switches the two levels for the measurement range set in the conversion unit 120 depending on the measurement values. With such a configuration, the measuring device 100 according to the variation of the present example embodiment may have a simpler configuration.

Third Example Embodiment

Figure 6A:
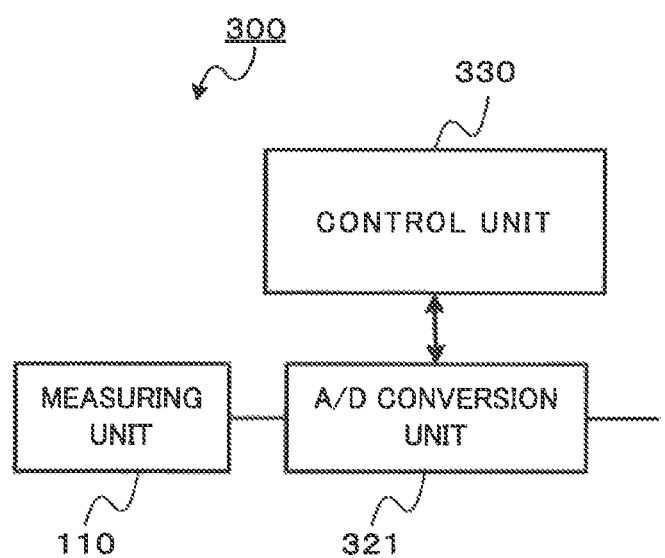
FIG. 6A is a diagram illustrating a measuring device in a third example embodiment of the present invention.
Figure 6B:
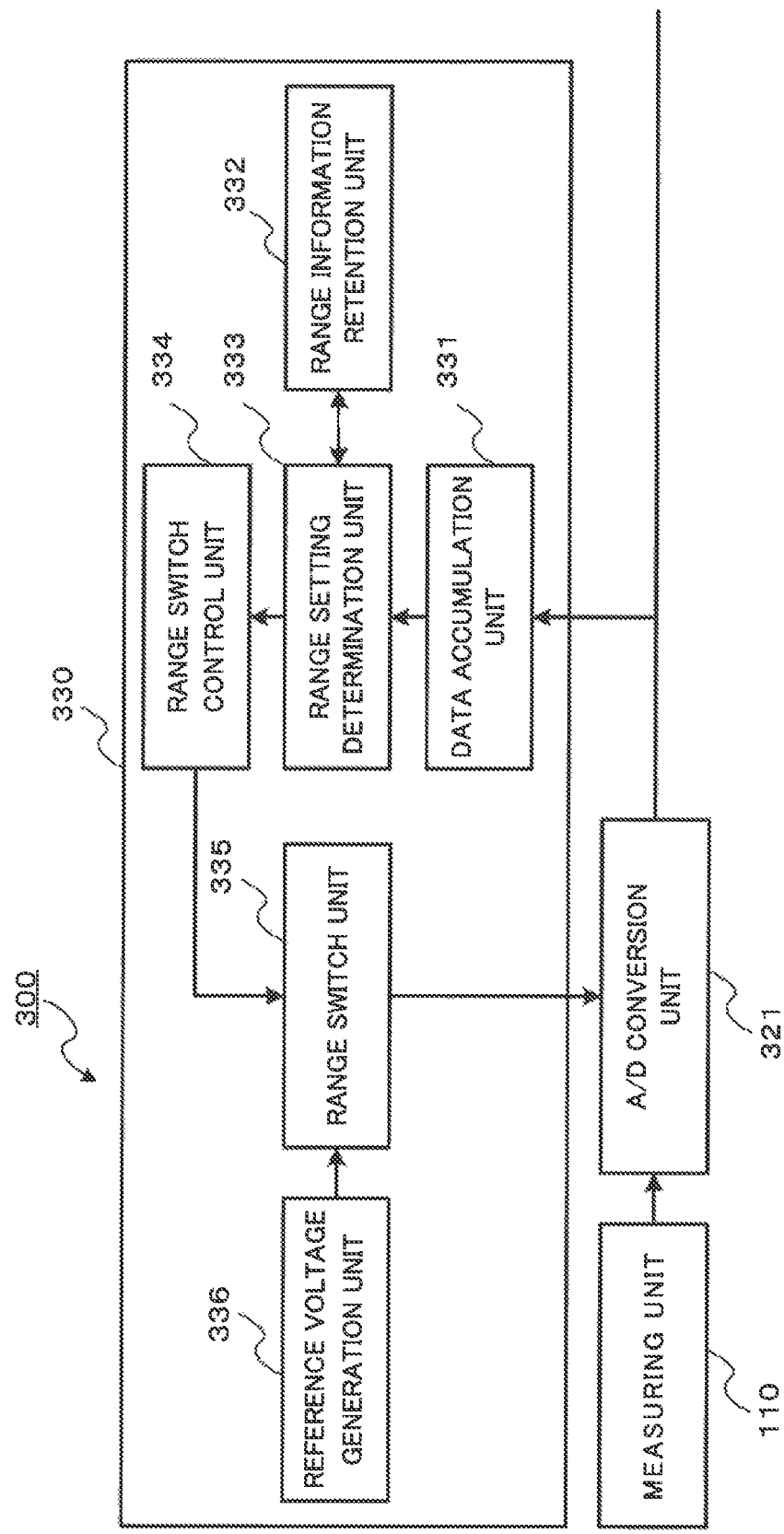
FIG. 6B is a diagram illustrating the measuring device in the third example embodiment of the present invention.
Figure 8:
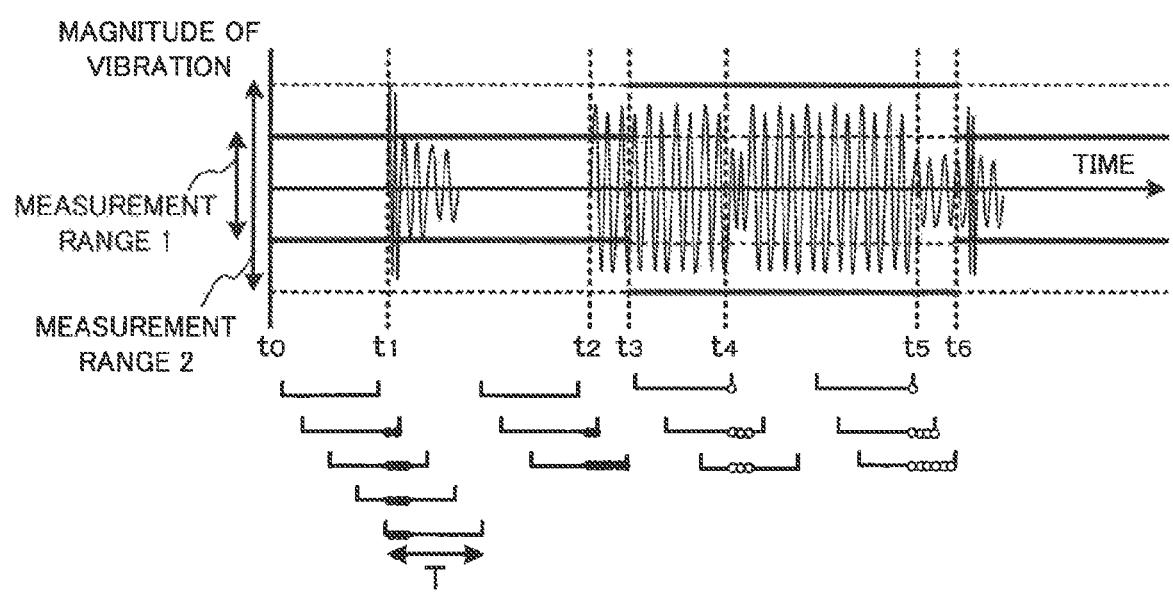
FIG. 8 is a diagram illustrating a relation between measurement ranges and determination periods relating to the operation of the measuring device in the third example embodiment of the present invention.

Next, a third example embodiment of the present invention will be described. FIGS. 6A and 6B are diagrams illustrating measuring devices in the third example embodiment of the present invention. FIG. 7 is a flowchart illustrating an operation of the measuring device in the third example embodiment of the present invention. FIG. 8 is a diagram illustrating a relation between measurement ranges and determination periods relating to the operation of the measuring device in the third example embodiment of the present invention.

As illustrated in FIG. 6A, a measuring device 300 in the third example embodiment of the present invention includes the measuring unit 110, an A/D conversion unit 321, and a control unit 330. The A/D conversion unit 321 converts measurement values, which are an analog signal and measured by the measuring unit 110, into a digital signal. As an example, any types of A/D converter is used as the A/D conversion unit 321.

In other words, the measuring device 300 in the present example embodiment differs from the measuring device 100 in the first example embodiment in that the conversion unit 120 is substituted with the A/D conversion unit 321. With regard to the other components, the measuring device 300 in the present example embodiment includes the same configuration as that of the measuring device 100 in the first or second example embodiment.

In the present example embodiment, the control unit 330 may be configured as illustrated in FIG. 6B as an example. That is, the control unit 330 includes a data accumulation unit 331, a range information retention unit 332, a range setting determination unit 333, a range switch control unit 334, a range switch unit 335, and a reference voltage generation unit 336.

In the example illustrated in FIG. 6B, the data accumulation unit 331 retains measurement values which have been converted to a digital signal by the A/D conversion unit 321 in the above-described determination period. The range information retention unit 332 retains setting information of a measurement range that is set with respect to the A/D conversion unit 321. Based on measurement values retained in the data accumulation unit 331 and setting information of the measurement range retained in the range information retention unit 332, the range setting determination unit 333 determines the measurement range that needs to be set. The range setting determination unit 333 retains the measurement range determined by the range setting determination unit 333 in the range information retention unit 332. In accordance with the measurement range determined by the range setting determination unit 333, the range switch control unit 334 controls the range switch unit 335 to set the determined measurement range. In accordance with control by the range switch control unit 334, the range switch unit 335 selects a reference voltage from the reference voltage generation unit 336 to provide the A/D conversion unit 321 with the selected reference voltage. The reference voltage generation unit 336 generates the reference voltage to be provided to the A/D conversion unit 321 depending on the measurement range. The reference voltage generated by the reference voltage generation unit 336 is determined appropriately depending on the type of the A/D conversion unit 321 and the measurement range to be set in the A/D conversion unit 321.

Next, using FIG. 7, an operation of the measuring device 300 in the present example embodiment will be described.

In the measuring device 300, the control unit 330 first sets the determination period, which serves as the above-described predetermined period (step S301). Subsequently, the control unit 330 sets the measurement range in the A/D conversion unit 321 (step S302). In these steps, the measuring device 300 in the present example embodiment may operate in the similar manner as the measuring device 100 in the first or second example embodiment of the present invention. Subsequently, the measuring unit 110 measures to acquire measurement values for the determination period which has been set in step S301, in the similar manner as in the operation of the measuring device 100 in step S103 in the first example embodiment (step S303). The measurement values acquired by the measuring unit 110 are converted, by the A/D conversion unit 321, into a digital signal within a range corresponding to the measurement range that has been previously set in the A/D conversion unit 321.

Subsequently, the control unit 330 determines whether the measurement values, which have been converted into a digital signal in step S303, include a value that is equal to the upper bound value or lower bound value of output of the A/D conversion unit 321 (step S304). It may be considered that this operation is corresponding to the operation of determining whether the measurement values exceed a measurement range in the measuring device 100 in the second example embodiment.

In step S304, when it is determined that the measurement value that is equal to the upper bound value or lower bound value of the output of the A/D conversion unit 321 exists, the measuring device 300 proceeds to an operation in step S305. In step S305, the control unit 330 determines whether the number of measurement values that are equal to the upper bound value or lower bound value of the output of the A/D conversion unit 321 is smaller than a predetermined determination threshold value.

In step S305, when it is determined that the number of measurement values that are equal to the upper bound value or lower bound value of the output of the A/D conversion unit 321 is smaller than the predetermined determination threshold value, the control unit 330 determines that a sudden vibration has been measured. This is because, the control unit 330 is able to determine that a period during which measurement values exceed the measurement range is short, since the number of measurement values that are equal to the upper bound value or lower bound value of the output of the A/D conversion unit 321 is smaller than the predetermined determination threshold value. Note that sudden vibrations include a shock response or a short disturbance vibration, for example. In this case, the measuring device 300 returns to step S303 and continues acquisition of measurement values.

In step S305, when it is determined that the number of measurement values that are equal to the upper bound value or lower bound value of the output of the A/D conversion unit 321 is greater than the predetermined determination threshold value, the control unit 330 determines that a vibration which exceeds the measurement range constantly has been measured. In this case, the control unit 330 sets the measurement range wider than the measurement range that has been set in the A/D conversion unit 321 at this point of time (step S322). Subsequently, the measuring device 300 returns to step S303 and continues acquisition of the measurement values.

In step S304, when it is determined that there is no measurement value that is equal to the upper bound value or lower bound value of the output of the A/D conversion unit 321, the control unit 330 proceeds to an operation in step S311. In step S311, the control unit 330 determines whether the measurement value included within the measuring limits of a measurement range narrower than the measurement range that has been set in the A/D conversion unit 321 exists. When it is determined that the measurement value included within the measuring limits of the measurement range narrower than the measurement range that has been set in the A/D conversion unit 321 exists, the control unit 330 proceeds to an operation in step S312. In step S312, the control unit 330 determines whether the number of measurement values that are included within the measuring limits of the narrow measurement range is greater than a predetermined threshold value (step S312). In this step, when it is determined that the number of measurement values included within the narrow measurement range is greater than the predetermined threshold value, the control unit 330 sets the measurement range that is narrower than the measurement range that has been set in the A/D conversion unit 321 at this point of time (step S313). Subsequently, the measuring device 300 returns to step S303 and continues acquisition of the measurement values.

In step S311, when it is determined that there is no measurement value included within the measurement range that is narrower than the measurement range that has been set in the A/D conversion unit 321, the measuring device 300 returns to step S303 and continues acquisition of the measurement values. In step S312, when it is determined that the number of measurement values included within the narrow measurement range is smaller than the predetermined threshold value, the measuring device 300 returns to step S303 and continues acquisition of the measurement values.

In the cases where a measurement range is assumed to take values at two levels, the operation of the measuring device 100 in the variation of the second example embodiment may also be applied to the present example embodiment.

Next, using FIG. 8, a relation between the measurement ranges and the determination periods relating to the above-described operation of the measuring device 300 will be described. In FIG. 8, it is assumed that the wave shape is a vibration wave shape, and the horizontal axis of the graph represents the time and the vertical axis of the graph represents the magnitudes of the measurement values representing the vibration wave shape (for example, values acquired by measuring acceleration, displacement, and the like of the vibration). It is assumed that a measurement range set in the A/D conversion unit 321 takes values at two levels. At time t0, which is a point of time at which measurement is started, it is assumed that the measurement range is set to a measurement range 1 which is a relatively narrow measurement range.

The measuring device 300 carries out an operation relating to the above-described measurement range change with the determination period being denoted by T. After measurement has been started from time t0, a sudden vibration due to a shock response is generated at time t1. Thus, the measurement values that are equal to the upper bound value or lower bound value of the A/D conversion unit 321 appear in each of the determination period including the time t1, as illustrated by signs of black dots (Yes in step S304 in FIG. 7). However, the control unit 330 determines that the number of measurement values that are equal to the upper bound value or lower bound value of the output of the A/D conversion unit 321 is smaller than the predetermined determination threshold value, for example (Yes in step S305 in FIG. 7). Therefore, the control unit 330 determines that the vibration at time t1 is a sudden vibration and does not change the measurement range set in the A/D conversion unit 321.

At and after time t2, the magnitude of the vibration wave shape increases. Thus, in each of the determination period including time t2, the measurement values that are equal to the upper bound value or lower bound value of the A/D conversion unit 321 appear in the measurement values. When, time t3 comes to be included in determination periods, for example, the control unit 330 determines that the number of measurement values that are equal to the upper bound value or lower bound value of the output of the A/D conversion unit 321 is greater than the predetermined determination threshold value (step S305 in FIG. 7). Therefore, the control unit 330 changes the measurement range set in the A/D conversion unit 321 to a measurement range 2 which is larger than the measurement range 1 (step S322 in FIG. 7).

After the above operations, at time t4, a vibration with the magnitude smaller than the vibrations having been generated theretofore occurs. Thus, in each determination period including the time t4, measurement values included within the measuring limits of the measurement range 1, which is a narrow measurement range, appear in the measurement values, as illustrated by signs of white circles (Yes in step S311 in FIG. 7). However, the control unit 330 determines that the number of measurement values included within the measuring limits of the measurement range 1 is smaller than the predetermined determination threshold value, for example. Therefore, the control unit 330 does not change the measurement range (No in step S312 in FIG. 7).

Subsequently, at and after time t5, the magnitude of the vibration decreases. Thus, in each determination period including the time t5, measurement values included within the measuring limits of the measurement range 1 appear in the measurement values. The measurement range 1 is a narrower measurement range. When time t6 comes to be included in determination periods, for example, the control unit 330 determines that the number of measurement values included within the measuring limits of the measurement range 1 is greater than the predetermined determination threshold value (Yes in step S312 in FIG. 7). The control unit 330 changes the measurement range to the measurement range 1 (step S313 in FIG. 7).

As described above, the measuring device 300 according to the present example embodiment sets a measurement range that is wider or narrower than the measurement range that has been set theretofore depending on measurement values, as with the measuring device 100 in the second example embodiment of the present invention. Thus, the measuring device 300 in the present example embodiment may increase measurement accuracy compared with the measuring device 100 in the first example embodiment. By including the A/D conversion unit 321, the measuring device 300 in the present example embodiment may set the measurement range easily.

Fourth Example Embodiment

Figure 9:
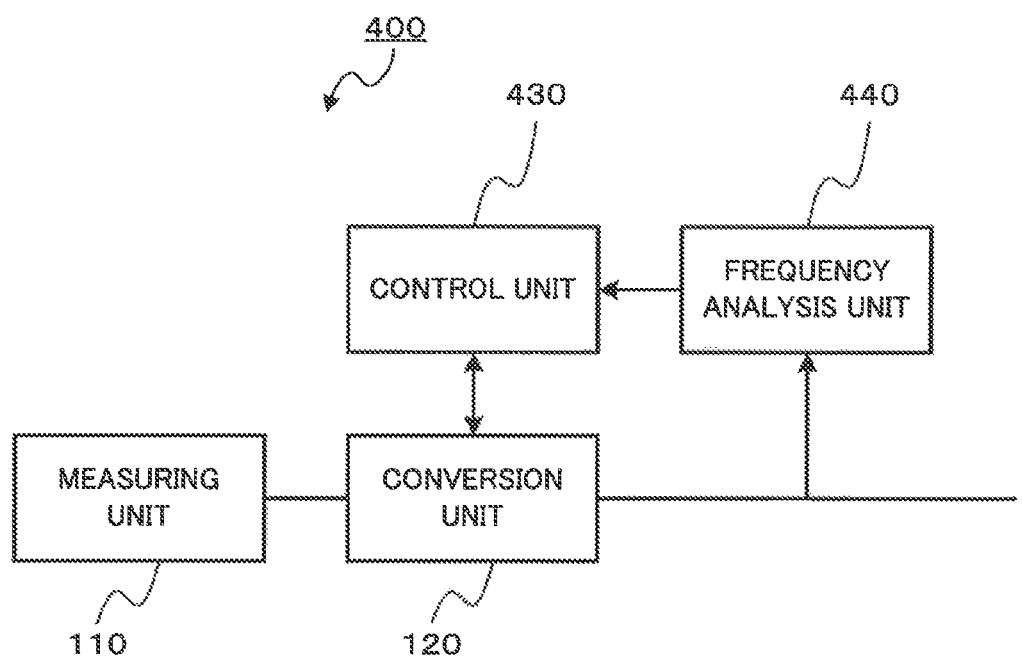
FIG. 9 is a diagram illustrating a measuring device in a fourth example embodiment of the present invention.
Figure 10:
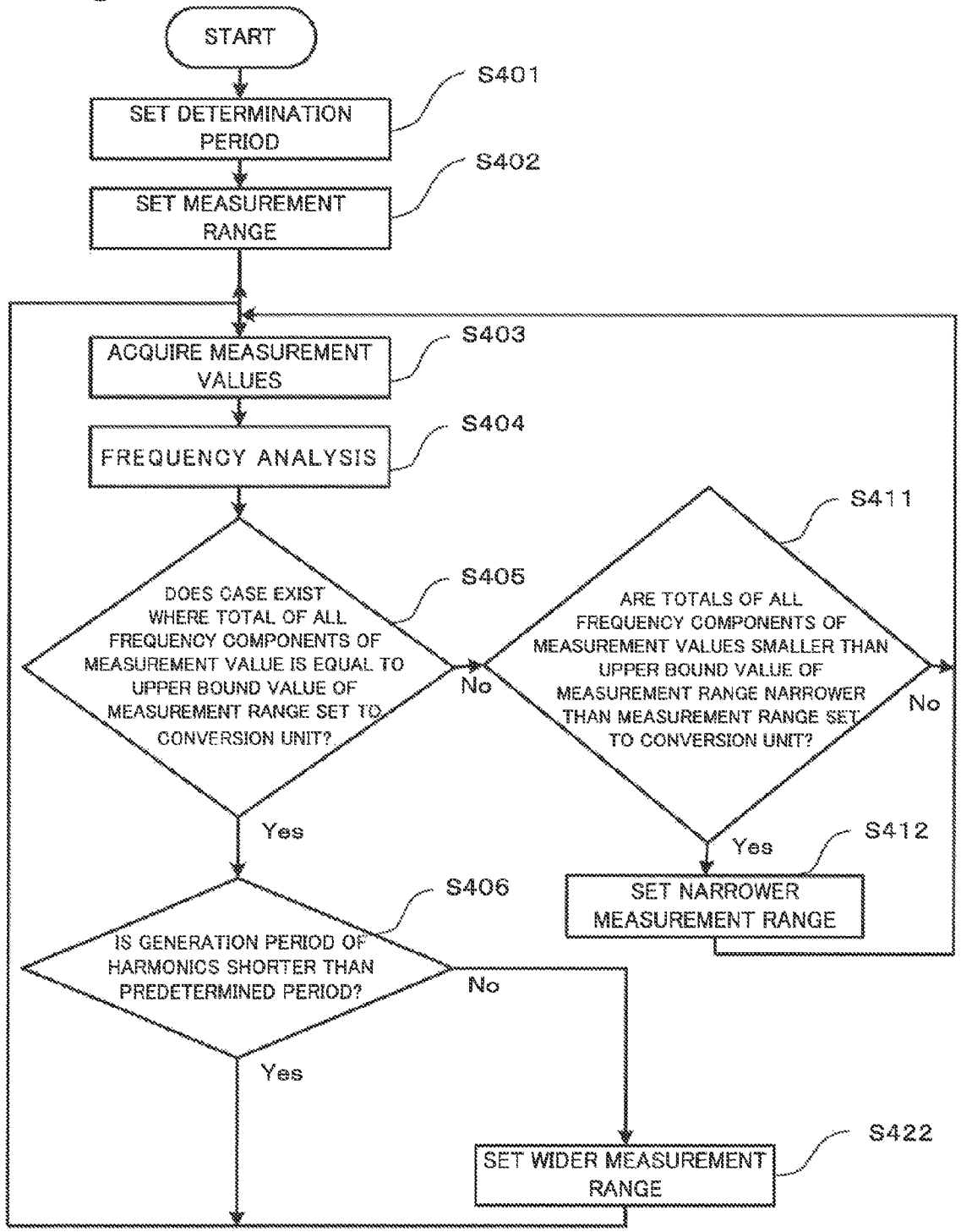
FIG. 10 is a flowchart illustrating an operation of the measuring device in the fourth example embodiment of the present invention.
Figure 11:
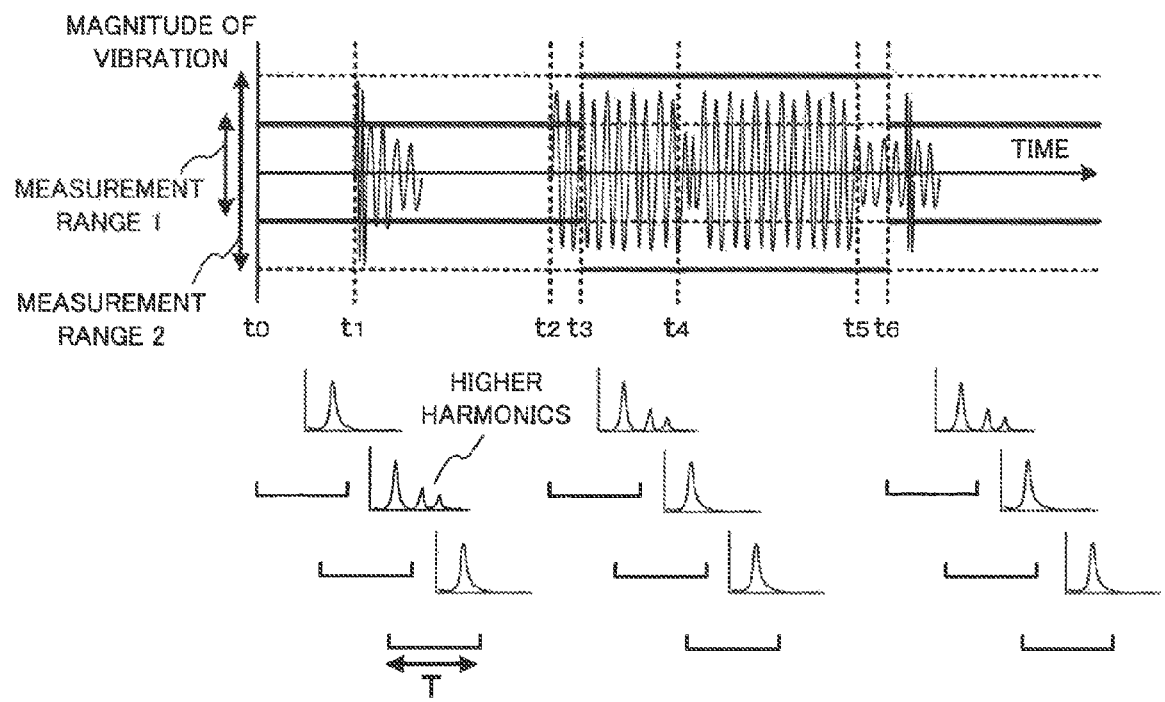
FIG. 11 is a diagram illustrating a relation between measurement ranges and determination periods relating to the operation of the measuring device in the fourth example embodiment of the present invention.

Next, a fourth example embodiment of the present invention will be described. FIG. 9 is a diagram illustrating a measuring device in the fourth example embodiment of the present invention. FIG. 10 is a flowchart illustrating an operation of the measuring device in the fourth example embodiment of the present invention. FIG. 11 is a diagram illustrating a relation between measurement ranges and determination periods relating to the operation of the measuring device in the fourth example embodiment of the present invention.

As illustrated in FIG. 9, a measuring device 400 according the fourth example embodiment of the present invention includes the measuring unit 110, the conversion unit 120, a control unit 430, and a frequency analysis unit 440. The frequency analysis unit 440 carries out frequency analysis of measurement values which have been converted into a predetermined format by the conversion unit 120.

In other words, the measuring device 400 in the present example embodiment differs from the measuring device 100 in the first example embodiment and the like in that the measuring device 400 includes the frequency analysis unit 440. With regard to the other components, the measuring device 400 in the present example embodiment may include the similar configuration as that of the measuring device in the example embodiment of the respective example embodiments of the present invention.

Next, using FIG. 10, an operation of the measuring device 400 in the fourth example embodiment of the present invention will be described.

In the measuring device 400, the control unit 430 first sets a determination period, which serves as the above-described predetermined period (step S401). Subsequently, the control unit 430 sets a measurement range in the conversion unit 120 (step S402). Next, the measuring unit 110 carries out measurement in the similar manner as in the operation in step S103 in the first example embodiment of the present invention to acquire the measurement values (step S403). In the steps described thus far, the measuring device 400 in the present example embodiment may operate in the similar manner as the measuring device 100 in the first example embodiment of the present invention.

Subsequently, the frequency analysis unit 440 carries out frequency analysis of the measurement values which have been converted by the conversion unit 120 (step S404). From the frequency analysis, data for respective frequencies on the measurement values are obtained.

Subsequently, with respect to the measurement values on which the frequency analysis was carried out in step S404, the control unit 430 determines whether a case exists where the total of all the frequency components of the measurement value is equal to the upper bound value of the measurement range set in the conversion unit 120 (step S405). That is, the control unit 430, for example, calculates a total of all the data for respective frequencies on the measurement value which were obtained in step S404, and determines whether a case exists where the total is equal to the upper bound value of the measurement range.

In step S405, when it is determined that a case exists in which the total of all the frequency components of the measurement value is equal to the upper bound value of the measurement range, the control unit 430 determines that the measurement values have reached the upper bound of the measurement range and carries out an operation in step S406. That is, based on the data for each frequency on the measurement values which were obtained in step S404, the control unit 430 determines whether a generation period of higher harmonics that are generated with respect to the measurement values converted by the conversion unit 120 is shorter than a predetermined period.

When a signal exceeding the limits of the measurement range is input, a wave shape of the measurement values converted by the conversion unit 120 is distorted from the original wave shape, and higher harmonics, are generated. The higher harmonics are frequency components corresponding to integer multiples of a resonant frequency. In the cases where the conversion unit 120 is an A/D converter, for example, clipping of a wave shape causes higher harmonics to be generated. In other words, carrying out determination based on the generation period of the higher harmonics enables determination of whether an alternating wave shape exceeding the measurement range set in the conversion unit 120 is a wave shape generated suddenly or a wave shape constantly exceeding the measurement range. Therefore, the control unit 430 determines, in step S406, whether the generation period of harmonics is shorter than the predetermined period.

In step S406, when it is determined that the generation period of the higher harmonics is shorter than the predetermined period, the control unit 430 determines that a sudden large wave shape was generated as a shock response and disturbance, for example, and has been measured. Then, the measuring device 400 returns to step S403 and continues acquisition of the measurement values by means of the measuring unit 110. On the other hand, in step S406, when it is determined that the generation period of higher harmonics is longer than the predetermined period, the control unit 430 determines that a wave shape constantly exceeding the measurement range has been measured. The control unit 430 sets the measurement range that is wider than the measurement range that has been set in the conversion unit 120 at this point of time (step S422). Subsequently, the measuring device 400 returns to step S403 and carries out acquisition of the measurement values by means of the measuring unit 110.

When the control unit 430 sets a wide measurement range in step S422, the newly set measurement range may be a previously determined range or another setting value newly determined based on the measurement values.

In step S405, when it is determined that there is no case where the total of all the frequency components of the measurement value is equal to the upper bound value of the measurement range set in the conversion unit 120, the control unit 430 carries out an operation in step S411. That is, in step S411, the control unit 430 determines whether the totals of all the frequency components of the measurement values are smaller than the upper bound value of the measurement range that is narrower than the measurement range set in the conversion unit 120.

In the cases where it is determined that the totals of all the frequency components of the measurement values are smaller than the upper bound value of the measurement range that is narrower than the measurement range set in the conversion unit 120, the control unit 430 carries out an operation in step S412. That is, the control unit 430 sets the measurement range that is narrower than the measurement range that has been set in the conversion unit 120 at this point of time. That is because the control unit 430 determines that a small vibration, which is included within the limit of the predetermined narrow measurement range, is to be measured. When the setting operation of the measurement range in step S412 is finished, the measuring device 400 returns to step S403 and carries out acquisition of measurement values by means of the measuring unit 110.

On the other hand, in step S411, when it is determined that there is a case where a measurement value exceeds the predetermined narrow measurement range in the determination period, the measuring device 400 returns to step S403 and carries out acquisition of measurement values.

In step S411, when the totals of all the frequency components of the measurement values are smaller than the upper bound value of the measurement range that is narrower than the measurement range set in the conversion unit 120, in the predetermined period, the control unit 440 is able to carry out the operation in step S412.

When the control unit 430 sets a narrow measurement range in step S412, the newly set measurement range may be a previously determined range, or a freely-selected measurement range determined based on the measurement values.

Next, using FIG. 11, a relation between the measurement ranges and the determination periods relating to the above-described operation of the measuring device 400 will be described. In FIG. 11, the alternating wave shape is a vibration wave shape, and the abscissa horizontal axis of the graph represents the time and the vertical axis of the graph represents the magnitudes of measurement values representing the vibration wave shape (for example, values acquired by measuring acceleration, displacement, and the like of the vibration). The measurement range set in the conversion unit 120 is assumed to take values at two levels. It is also assumed that, a measurement range 1 which is a relatively narrow measurement range, is set in the conversion unit 120 at a time t0, which is a point of time at which measurement is started. In this case, the measuring device 400 carries out an operation relating to the above-described measurement range change, with the determination period denoted by T. In FIG. 11, a graph corresponding to each of the determination periods T illustrates frequency components of a vibration at any point of time included in the determination period T. In the respective graphs, the horizontal axis represents frequency and the vertical axis represents the magnitude of vibration for each frequency.

In the case where measurement by means of the measuring device 400 has been started at the time t0, a sudden vibration due to a shock response occurs at a time t1. Thus, as illustrated in the graphs of the frequency components corresponding to the respective determination periods T in FIG. 11, higher harmonics appear in an analysis result from the frequency analysis unit 440 for a determination period including the time t1. However, the control unit 430 determines that the generation period of the harmonics is shorter than the predetermined period (Yes in step S406 in FIG. 10), for example. Therefore, the control unit 430 determines that the vibration at the time t1 is a sudden vibration, and does not change the measurement range set in the conversion unit 120.

At and after a time t2, the magnitude of the vibration wave shape increases. Thus, in each determination period including the time t2, higher harmonics appear in an analysis result from the frequency analysis unit 440. Then, for example, when a time t3 comes to be included in determination periods, the control unit 430 determines that the generation period of the harmonics is longer than the predetermined period (step S406 in FIG. 10). Therefore, the control unit 330 changes the measurement range set in the conversion unit 120 to a measurement range 2 which is larger than the measurement range 1 (step S422 in FIG. 10).

After that, at and after a time t5, the magnitude of the vibration decreases. When a time t6 comes to be included in determination periods, for example, the control unit 430 determines that the totals of all the frequency components of the measurement values are smaller than the upper bound value of the measurement range 1, which is narrower than the measurement range 2 having been set (Yes in step S411 in FIG. 7). The control unit 330 changes the measurement range to the measurement range 1 (step S412 in FIG. 10).

As described thus far, the measuring device 400 according to the present example embodiment sets a measurement range that is wider or narrower than the measurement range that has been set theretofore depending on measurement values, as with the measuring device 100 in the second example embodiment of the present invention. Therefore, the measuring device 400 in the present example embodiment may increase measurement accuracy compared with the measuring device 100 in the first example embodiment. The measuring device 400 in the present example embodiment may carry out setting of the measurement range further more accurately by including the frequency analysis unit 440.

Fifth Example Embodiment

Figure 12:
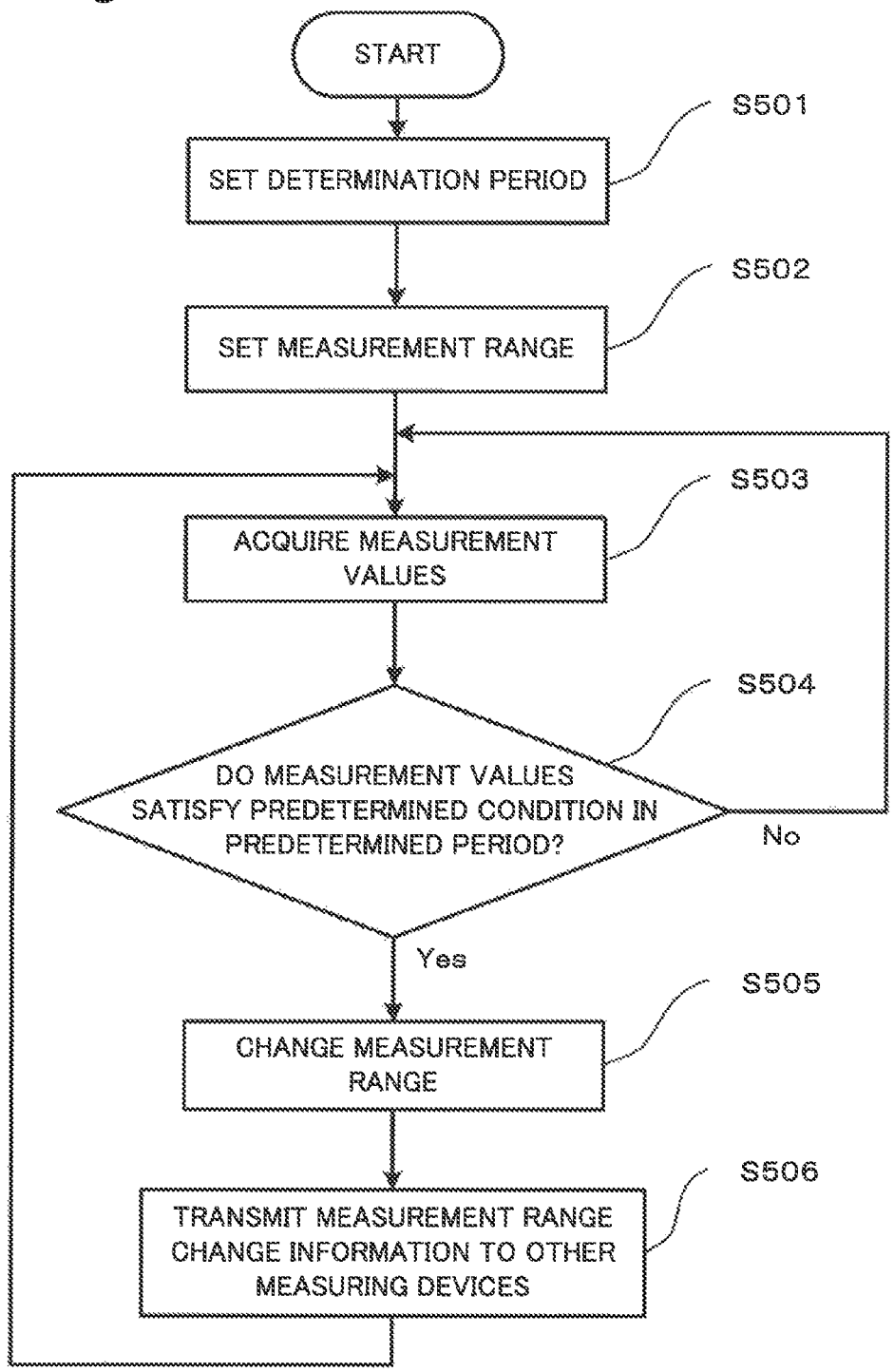
FIG. 12 is a flowchart illustrating an operation of a measuring device in a fifth example embodiment of the present invention.
Figure 13:
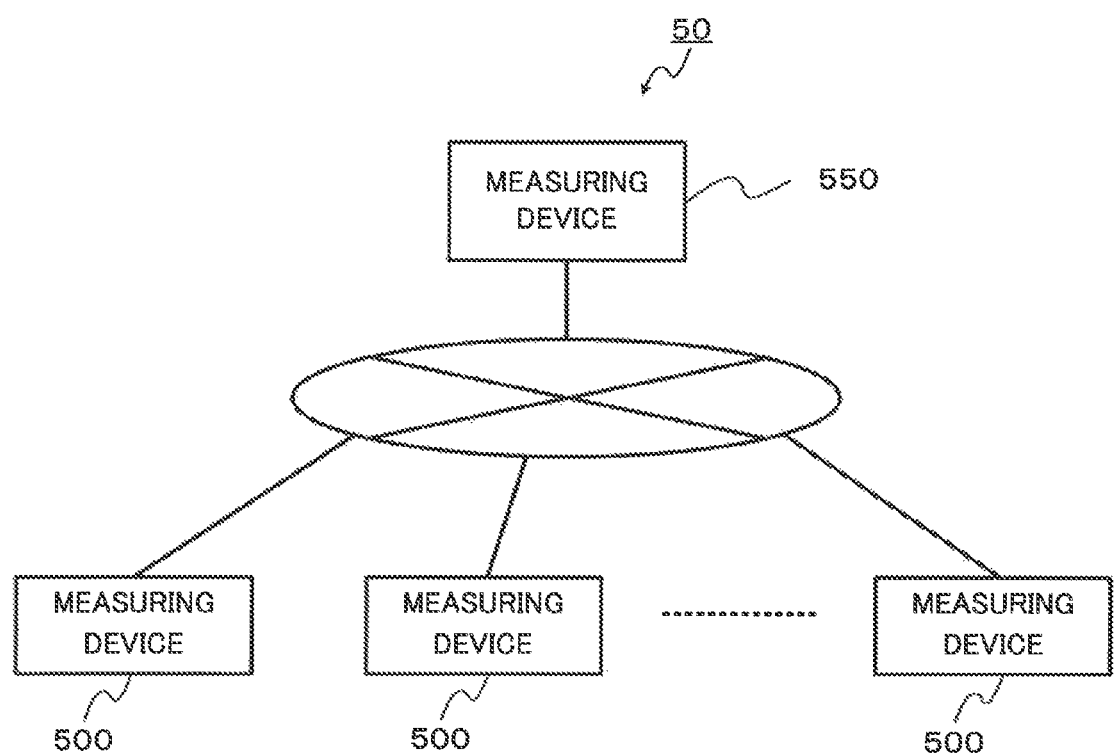
FIG. 13 is a diagram illustrating a configuration of a measuring system in the fifth example embodiment of the present invention.

Subsequently, a fifth example embodiment of the present invention will be described. FIG. 12 is a flowchart illustrating an operation of a measuring device in the fifth example embodiment of the present invention. FIG. 13 is a diagram illustrating a configuration of a measuring system 50 in the fifth example embodiment of the present invention. A measuring device 500 in the fifth example embodiment of the present invention may include the similar configuration as that of the measuring device 100 in the first example embodiment of the present invention.

Using FIG. 12, an operation of the measuring device 500 in the fifth example embodiment of the present invention will be described. In FIG. 12, it may be assumed that operations of the measuring device 500 from steps S501 to S505 are similar operations of the measuring device 100 from steps S101 to S105 in the first example embodiment of the present invention illustrated in FIG. 2, respectively. Subsequently to change of the measurement range set in the conversion unit 120 in step S505, the control unit 130 transmits the measurement-range-change information, which instructs another measuring device to change the measurement range (step S506). Subsequently, the measuring device 500 returns to step S503 and carries out acquisition of the measurement values.

Another measuring device that has received the measurement-range-change information may change measurement ranges set in the measuring devices based on the information.

In the cases of measuring an alternating wave shape generated from an identical generation source by using the plurality of measuring devices 500, the alternating wave shape sometimes propagates to respective ones of the plurality of measuring devices 500 in similar modes. Therefore, there is a possibility that, when an alternating wave shape to be measured varies to the extent change in the measurement range set in the conversion unit 120 is needed, at one of the measuring device 500, the alternating wave shape to be measured also varies at other measuring devices 500 in the similar manner.

Therefore, in the cases of changing the measurement range, the measuring device 500 in the present example embodiment makes the other measuring devices 500 change measurement ranges set in the conversion units 120 thereof by transmitting the measurement-range-change information to the other measuring devices 500. Such a configuration may increase a possibility that the conversion units 120 carry out conversion of measurement values accurately at the other measuring devices 500. For example, when the conversion unit 120 is an A/D converter, changing the measurement range may decrease a possibility that the conversion unit 120 outputs a value (the upper bound value of the measurement range and the like) different from an actual signal value as a conversion result due to clipping of a wave shape.

In the present example embodiment, the control units 130 of the measuring devices 500 may transmit the measurement-range-change information having any kinds of contents. For example, the control unit 130 may transmit the measurement-range-change information to another measuring device 500 adjacent to the measuring device 500 to make the another measuring device 500 change a measurement range in the similar manner as in the change of the measurement range that the control unit 130 has carried out. A control unit 130 may transmit the measurement-range-change information to the other measuring device 500 away by a predetermined distance from the measuring device 500 to make the other measuring device 500 change the measurement range in the similar manner as in the change of a measurement range that the control unit 130 has carried out. When the conversion unit 120 of the measuring device 500 is capable of setting a plurality of measurement ranges, the control unit 130 thereof may further transmit the measurement-range-change information with a measurement ranges to be set switched depending on a distance from the own device (the measuring device 500). Transmission destinations of measurement-range-change information and specifications of the measurement range change instructed in measurement-range-change information may be defined in an appropriate manner depending on the types of alternating wave shapes to be measured by the measuring devices 500 and the arrangement conditions of the measuring devices 500.

The configuration of the measuring device 500 in the present example embodiment and the configurations of measuring devices in the second to fourth example embodiments of the present invention may be combined with one another.

Next, using FIG. 13, a configuration of the measuring system 50 in the present example embodiment will be described.

According to FIG. 13, the measuring system 50 in the present example embodiment includes a plurality of the measuring devices 500 and an analysis device 550. The analysis device 550 carries out analysis of an alternating wave shape based on measurement values measured by respective ones of the plurality of measuring devices 500. The respective ones of the plurality of measuring devices 500 and the analysis device 550 are interconnected in a communicable manner, for example.

Note that the configurations of measuring devices in the respective example embodiments of the present invention may be used in combination with one another for the plurality of measuring devices 500 included in the measuring system 50.

The measuring system 50 in the present example embodiment carries out analysis of an alternating wave shape based on the measurement values measured by the respective ones of the plurality of measuring devices 500. Therefore, the measuring system 50 in the present example embodiment may be used in vibration analysis for finding abnormality, deterioration, and the like in a large-scale structure such as water supply pipes and a bridge.

The measuring device 500 may transmit the above-described measurement-range-change information to the analysis device 550. When receiving the measurement-range-change information from at least one of the plurality of measuring devices 500, the analysis device 550 may, based on the received measurement-range-change information, transmit measurement-range-change information to a plurality of the measuring devices 500 that are different from the transmission source. Such a configuration may increase a possibility that the conversion units 120 in the other measuring devices 500 carries out conversion of the measurement values accurately.

As described thus far, the measuring devices 500 in the present example embodiment provide the same advantageous effects as those of the measuring device 100 in the first example embodiment of the present invention. The measuring device 500 in the present example embodiment transmits measurement-range-change information to another measuring device 500. Such a configuration enables the other measuring device 500 to change the measurement range set in the conversion unit 120 thereof. Therefore, the measuring devices 500 in the present example embodiment may carry out conversion of the measurement values accurately.

The present invention was described above through example embodiments thereof, but the present invention is not limited to the above example embodiments. Various modifications that could be understood by a person skilled in the art may be applied to the configurations and details of the present invention within the scope of the present invention. The configurations in the respective example embodiments may be combined with one another without departing from the spirit and scope of the present invention.

This application claims priority based on Japanese Patent Application No. 2014-131193, filed on Jun. 26, 2014, the entire disclosure of which is incorporated herein by reference.

REFERENCE SIGNS LIST

50 Measuring system
100, 300, 400, 500 Measuring device
110 Measuring unit
120 Conversion unit
321 A/D conversion unit
130, 330, 430 Control unit
331 Data accumulation unit
332 Range information retention unit
333 Range setting determination unit
334 Range switch control unit
335 Range switch unit
336 Reference voltage generation unit
440 Frequency analysis unit
550 Analysis device
1000 Information processing device
1001 CPU
1002 ROM
1003 RAM
1004 Program
1005 Storage device
1006 Storage medium
1007 Drive device
1008 Communication interface
1009 Communication network
1010 Input-output interface
1011 Bus

The invention claimed is:

1. A measuring device, comprising:
at least one processor configured to function as:
a measuring unit configured to measure changes of an index with time, the index relating to an object event;
a conversion unit configured to convert measurement values measured by the measuring unit into a predetermined format within a measurement range which is previously set; and
a control unit configured to control the measurement range, the control unit changing the measurement range when conversion values obtained by converting the measurement values by the conversion unit satisfy a predetermined condition in a predetermined period, wherein the control unit changes the measurement range to a wider measurement range than the measurement range when it is determined that the conversion values exceed the measurement range continuously in the predetermined period.

2. The measuring device according to claim 1, wherein the control unit changes the measurement range to a narrower measurement range than the measurement range when the conversion values are included within a narrower measurement range than the measurement range during the predetermined period.

3. The measuring device according to claim 1, wherein the measuring unit is an A/D converter that converts an analog signal into a digital signal.

4. The measuring device according to claim 3, wherein the control unit changes the measurement range to a wider measurement range than the measurement range when a number of values that are equal to an upper bound value or a lower bound value of output values from the A/D converter among the conversion values is greater than a predetermined threshold value.

5. The measuring device according to claim 1, the at least one processor further configured to act as:
a frequency analysis unit configured to analyze frequency on the conversion values,
wherein the control unit changes the measurement range to a wider measurement range than the measurement range when determining that higher harmonics with respect to the conversion values are generated continuously in the predetermined period based on a result from the frequency analysis.

6. The measuring device according to claim 1, wherein the control unit transmits information for instructing measurement range change to another measuring device in the case of changing the measurement range.

7. A measuring system, comprising:
a plurality of the measuring devices according to claim 1; and
an analysis device configured to carry out analysis of a wave shape based on the conversion values in respective ones of the plurality of measuring devices.

8. A measuring method comprising:
converting measurement values obtained by measuring changes of an index with time, the index relating to an object event, into a predetermined format within a measurement range previously set by conversion means; and
changing the measurement range of the conversion means when conversion values obtained by converting the measurement values satisfy a predetermined condition in a predetermined period, wherein the measurement range is changed to a wider measurement range than the measurement range when it is determined that the conversion values exceed the measurement range continuously in the predetermined period.

9. A non-transitory computer-readable recording medium storing a program, the program causing a computer to execute:
a process of converting measurement values obtained by measuring changes of an index with time, the index relating to an object event, into a predetermined format within a measurement range; and
a process of changing the measurement range of the conversion means when conversion values obtained by converting the measurement values satisfy a predetermined condition in a predetermined period, wherein the measurement range is changed to a wider measurement range than the measurement range when it is determined that the conversion values exceed the measurement range continuously in the predetermined period.

10. The measuring method of claim 8, wherein the measurement range is changed to a narrower measurement range than the measurement range when the conversion values are included within a narrower measurement range than the measurement range during the predetermined period.

11. The non-transitory computer-readable recording medium of claim 9, wherein the measurement range is changed to a narrower measurement range than the measurement range when the conversion values are included within the narrower measurement range than the measurement range during the predetermined period.

* * * * *